(12) United States Patent
Jin

(10) Patent No.: US 11,637,092 B2
(45) Date of Patent: Apr. 25, 2023

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 84 days.

(21) Appl. No.: 17/218,831

(22) Filed: Mar. 31, 2021

(65) Prior Publication Data
US 2022/0122947 A1 Apr. 21, 2022

(30) Foreign Application Priority Data
Oct. 21, 2020 (CN) .......................... 202011133059.X

(51) Int. Cl.
*H01L 25/07* (2006.01)
*H01L 25/18* (2023.01)
(Continued)

(52) U.S. Cl.
CPC ........ *H01L 25/074* (2013.01); *H01L 25/0657* (2013.01); *H01L 25/18* (2013.01);
(Continued)

(58) Field of Classification Search
None
See application file for complete search history.

(56) References Cited

U.S. PATENT DOCUMENTS

2022/0122947 A1* 4/2022 Jin .................... H01L 29/42392

* cited by examiner

*Primary Examiner* — Jack S Chen
(74) *Attorney, Agent, or Firm* — Crowell & Moring, L.L.P.

(57) ABSTRACT

A semiconductor structure and a forming method thereof are provided. One form of a semiconductor structure includes: a first device structure, including a first substrate and a first device formed on the first substrate, the first device including a first channel layer structure located on the first substrate, a first device gate structure extending across the first channel layer structure, and a first source-drain doping region located in the first channel layer structure on two sides of the first device gate structure; and a second device structure, located on a front surface of the first device structure, including a second substrate located on the first device structure and a second device formed on the second substrate, the second device including a second channel layer structure located on the second substrate, a second device gate structure extending across the second channel layer structure, and a second source-drain doping region located in the second channel layer structure on two sides of the second device gate structure, where projections of the second channel layer structure and the first channel layer structure onto the first substrate intersect non-orthogonally. The electricity of the first device can be led out according to the present disclosure.

12 Claims, 7 Drawing Sheets

(51) Int. Cl.
  *H01L 25/065* (2023.01)
  *H01L 25/00* (2006.01)
  *H01L 23/00* (2006.01)
  *H01L 29/66* (2006.01)
(52) U.S. Cl.
  CPC .............. *H01L 25/50* (2013.01); *H01L 24/29* (2013.01); *H01L 24/32* (2013.01); *H01L 29/66742* (2013.01); *H01L 29/66795* (2013.01); *H01L 2224/29186* (2013.01); *H01L 2224/32145* (2013.01); *H01L 2225/06562* (2013.01); *H01L 2924/13067* (2013.01); *H01L 2924/13069* (2013.01)

SEMICONDUCTOR STRUCTURE AND FORMING METHOD THEREOF

RELATED APPLICATIONS

The present application claims priority to Chinese Patent Appln. No. 202011133059.X, filed Oct. 21, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

With the development trend of very large-scale integration (VLSI) in semiconductor manufacturing, a feature size of an integrated circuit (IC) continues to decrease. To adapt to the decrease in feature size, a channel length of metal-oxide-semiconductor field-effect transistor (MOSFET) also continues to decrease.

However, as a channel length of a device becomes smaller, a distance between a source and a drain of the device decreases accordingly. Therefore, a channel control capability of a gate deteriorates, and it becomes increasing difficult for a gate voltage to pinch off a channel, resulting in an increased possibility of subthreshold leakage, that is, the so-called short-channel effect (SCE).

Therefore, to better adapt to the decrease in feature size, semiconductor processes are gradually transitioning from a planar MOSFET to a three-dimensional transistor with higher efficiency.

The vertically stacked complementary FET (CFET) is a revolutionary three-dimensional transistor. In the CFET structure, P-channel metal oxide semiconductor (PMOS) transistors and N-channel metal oxide semiconductor (NMOS) transistors stacked vertically to each other form complementary devices, so as to save area, and improve the transistor integration density, thereby bringing advantages in power consumption and price-performance ratio.

SUMMARY

A problem to be addressed in embodiments and implementations of the present disclosure is to provide a semiconductor structure and a forming method thereof, to lead out the electricity of a first device.

To address the foregoing problem, the present disclosure provides forms of a semiconductor structure. In one form, a semiconductor structure includes: a first device structure, including a first substrate and a first device formed on the first substrate, the first device including a first channel layer structure located on the first substrate, a first device gate structure extending across the first channel layer structure, and a first source-drain doping region located in the first channel layer structure on two sides of the first device gate structure, a surface, close to a top portion of the first device gate structure, in the first device structure being a front surface; and a second device structure, located on the front surface of the first device structure, and including a second substrate located on the first device structure and a second device formed on the second substrate, the second device including a second channel layer structure located on the second substrate, a second device gate structure extending across the second channel layer structure, and a second source-drain doping region located in the second channel layer structure on two sides of the second device gate structure, where projections of the second channel layer structure and the first channel layer structure onto the first substrate intersect non-orthogonally.

The present disclosure further provides forms of a forming method of a semiconductor structure. In one form, a forming method of a semiconductor structure includes: forming a first device structure, including a first substrate and a first device formed on the first substrate, the first device including a first channel layer structure located on the first substrate, a first device gate structure extending across the first channel layer structure, and a first source-drain doping region located in the first channel layer structure on two sides of the first device gate structure, a surface, close to a top portion of the first device gate structure, in the first device structure being a front surface; disposing a second substrate on the front surface of the first device structure; forming a second channel layer structure on the second substrate after the second substrate is formed on the front surface of the first device structure, projections of the second channel layer structure and the first channel layer structure onto the first substrate intersecting non-orthogonally; and forming a second device gate structure and a second source-drain doping region on the second substrate, the second device gate structure extending across the second channel layer structure, the second source-drain doping region being located in the second channel layer structure on two sides of the second device gate structure, the second source-drain doping region, the second device gate structure, and the second channel layer structure being configured to form a second device, the second device and the second substrate being configured to form a second device structure.

Compared with the prior art, technical solutions in embodiments and implementations of the present disclosure have at least the following advantages.

Embodiments and implementations of the present disclosure provide a semiconductor structure, the semiconductor structure including a first device structure and a second device structure located on a front surface of the first device structure. The first device structure includes a first device. The first device includes a first channel layer structure and a first device gate structure extending across the first channel layer structure. The second device structure includes a second device. The second device includes a second channel layer structure and a second device gate structure extending across the second channel layer structure. Projections of the second channel layer structure and the first channel layer structure onto the first substrate intersect non-orthogonally. Correspondingly, the projections of the second device gate structure and the first device gate structure onto the first substrate intersect non-orthogonally. Therefore, when a source-drain plug connected to a first source-drain doping region in the first device is formed, or, when a gate plug connected to the first device structure in the first device is formed, the probability that the forming process of the source-drain plug or the gate plug is blocked by the second device can be reduced, so that it is easy to lead out the electricity of the first device. Moreover, the first device and the second device are independent of each other, and the electrical isolation can still be implemented between the first device and the second device.

DETAILED DESCRIPTION

It can be learned from the related art that, a CFET device structure includes PMOS transistors and NMOS transistors stacked vertically to each other. However, currently, it is difficult to lead out the electricity of a lower-layer transistor in the CFET device structure.

The reason why it is difficult to lead out the electricity of a lower-layer transistor in the CFET device structure is analyzed with reference to a semiconductor structure.

Figure 1:
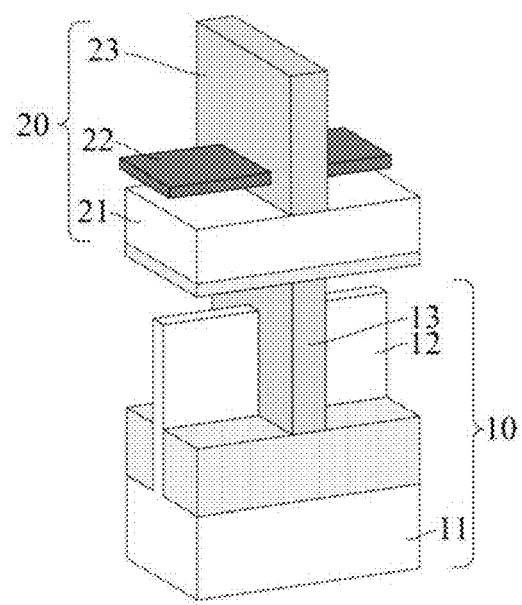
FIG. 1 is a three-dimensional diagram of a semiconductor structure.

FIG. 1 is a three-dimensional diagram of a semiconductor structure.

The semiconductor structure includes: a first device structure 10, including a first substrate 11 and a first device (not shown) formed on the first substrate 11, the first device including a first channel layer structure 12 located on the first substrate 11, a first device gate structure 13 extending across the first channel layer structure 12, and a first source-drain doping region (not shown in the figure) located in the first channel layer structure 12 on two sides of the first device gate structure 13, a surface, close to a top portion of the first device gate structure 13, in the first device structure 10 being a front surface (not shown); and a second device structure 20, bonded to the front surface of the first device structure 10, and including a second substrate 21 located on the first device structure 10 and a second device (not shown) formed on the second substrate 21, the second device including a second channel layer structure 22 located on the second substrate 21, a second device gate structure 23 surrounding the second channel layer structure 22, and a second source-drain doping region (not shown in the figure) located in the second channel layer structure 22 on two sides of the second device gate structure 23.

The first source-drain doping region and the second source-drain doping region are formed independently. The second channel layer structure 22 and the first channel layer structure 12 are parallel to each other. The second device gate structure 23 and the first device gate structure 13 are also parallel to each other.

Specifically, in a direction pointing from the second device structure 20 to the first device structure 10, the second channel layer structure 22 completely covers the first channel layer structure 12, and the second device gate structure 23 completely covers the first device gate structure 13. For example, a projection of the first channel layer structure 12 onto the first substrate 11 is located within a projection of the second channel layer structure 22 onto the first substrate 11, and projections of the second device gate structure 23 and the first device gate structure 13 onto the first substrate 11 overlap.

The semiconductor structure needs to implement the vertical integration and the electrical isolation between the first device and the second device at the same time. However, because the second channel layer structure 22 completely covers the first channel layer structure 12, and the second device gate structure 23 completely covers the first device gate structure 13, both a gate plug and a source-drain plug in the first device are blocked by the second device, and it is difficult to lead out the electricity of the first device.

To address this technical problem, embodiments and implementations of the present disclosure provide a semiconductor structure. In the semiconductor structure, projections of the second channel layer structure and the first channel layer structure onto the first substrate intersect non-orthogonally. Correspondingly, the projections of the second device gate structure and the first device gate structure onto the first substrate intersect non-orthogonally. Therefore, when a source-drain plug connected to a first source-drain doping region in the first device is formed, or, when a gate plug connected to the first device structure in the first device is formed, the probability that the forming process of the source-drain plug or the gate plug is blocked by the second device can be reduced, so that it is easy to lead out the electricity of the first device. Moreover, the first device and the second device are independent of each other, and therefore the electrical isolation can still be implemented between the first device and the second device.

In order to make the foregoing objectives, features, and advantages of embodiments and implementations of the present disclosure more apparent and easier to understand, specific embodiments and implementations of the present disclosure are described below in detail with reference to the accompanying drawings.

Figure 2:
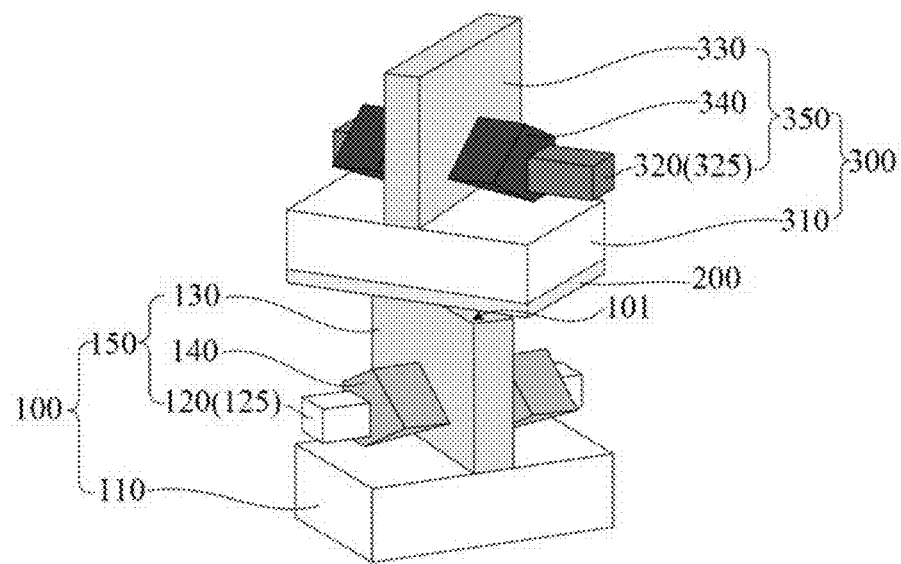
FIG. 2 is a three-dimensional diagram of one form of a semiconductor structure according to the present disclosure.
Figure 3:
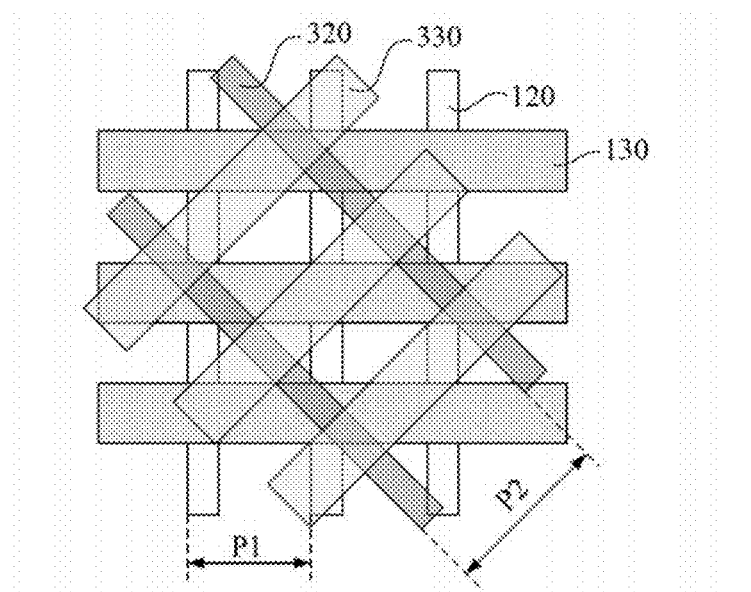
FIG. 3 is a top view corresponding to the semiconductor structure shown in FIG. 2.
Figure 4:
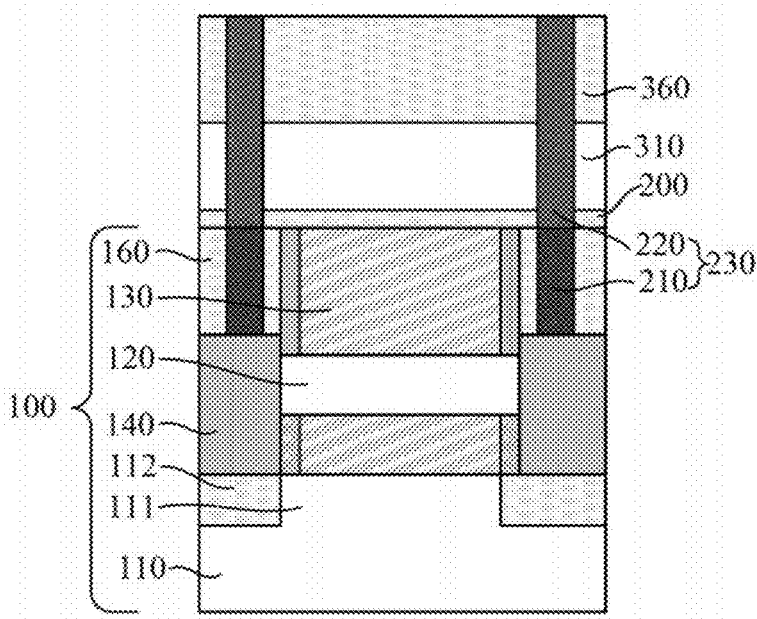
FIG. 4 is a cross-sectional view of the semiconductor structure shown in FIG. 2 at a location where a second device is exposed and in an extending direction of a first channel layer structure.
Figure 5:
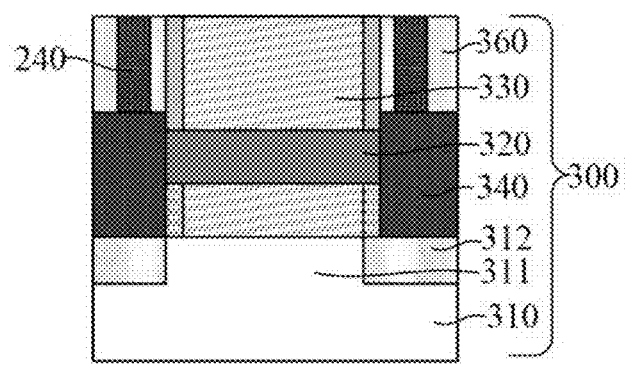
FIG. 5 is a cross-sectional view of a second device structure in the semiconductor structure shown in FIG. 2 in an extending direction of a second channel layer structure.

With reference to FIG. 2 to FIG. 5, FIG. 2 is a three-dimensional diagram of one form of a semiconductor structure according to the present disclosure. FIG. 3 is a top view corresponding to the semiconductor structure shown in FIG. 2. FIG. 4 is a cross-sectional view of the semiconductor structure shown in FIG. 2 at a location where a second device is exposed and in an extending direction of a first channel layer structure. FIG. 5 is a cross-sectional view of a second device structure in the semiconductor structure shown in FIG. 2 in an extending direction of a second channel layer structure.

The semiconductor structure includes: a first device structure 100, including a first substrate 110 and a first device 150 formed on the first substrate 110, the first device 150 including a first channel layer structure 120 located on the first substrate 110, a first device gate structure 130 extending across the first channel layer structure 120, and a first source-drain doping region 140 located in the first channel layer structure 120 on two sides of the first device gate structure 130, a surface, close to a top portion of the first device gate structure 130, in the first device structure 100 being a front surface 101; and a second device structure 300, located on the front surface 101 of the first device structure 100, and including a second substrate 310 located on the first device structure 100 and a second device 350 formed on the second substrate 310, the second device 350 including a second channel layer structure 320 located on the second substrate 310, a second device gate structure 330 extending across the second channel layer structure 320, and a second source-drain doping region 340 located in the second channel layer structure 320 on two sides of the second device gate structure 330, where projections of the second channel layer structure 320 and the first channel layer structure 120 onto the first substrate 110 intersect non-orthogonally.

In the semiconductor structure, generally, the electricity of the first source-drain doping region 140 is led out through a source-drain plug connected to the first source-drain doping region 140, and the electricity of the first device gate structure 130 is led out through a gate plug connected to the first device gate structure 130. In some implementations, projections of the second channel layer structure 320 and the first channel layer structure 120 onto the first substrate 110 intersect non-orthogonally, and therefore, the probability that the second device 350 completely covers the first device 150 is reduced. When the source-drain plug connected to the first source-drain doping region 140 is formed, or, when the gate plug connected to the first device gate structure 130 is formed, the probability that the forming process of the source-drain plug or the gate plug is blocked by the second device 350 can be reduced, so that it is easy to lead out the electricity of the first device 150. Moreover, the first device 150 and the second device 350 are still independent of each other, and therefore the electrical isolation can still be implemented between the first device 150 and the second device 350.

In this form, the semiconductor structure is a CFET, and therefore, in the CFET structure, the first device 150 and the second device 350 are vertically stacked, so as to save area, and improve the transistor integration density, thereby bringing advantages in power consumption and price-performance ratio.

Specifically, channel conduction types of the first device 150 and the second device 350 are different, and therefore, the first device 150 and the second device 350 that are stacked vertically to each other form complementary devices.

In this form, the first device 150 is an NMOS device, and the second device 350 is a PMOS device. In some other forms, the first device is a PMOS device, and the second device is an NMOS device.

It is to be noted that, in other forms, according to device design requirements, the channel conduction types of the first device and the second device may be alternatively the same, but device performance types are different. For example, threshold voltages of the first device and the second device are different.

In an example, both the first device 150 and the second device 350 are gate-all-around (GAA) devices. In other forms, the first device may be alternatively a fin field-effect transistor (FinFET), the second device may be alternatively a FinFET, and structure types of the first device and the second device may be alternatively different. For example, the first device is a FinFET, and the second device is a GAA device.

In this form, the first device structure 100 includes the first substrate 110 and the first device 150 formed on the first substrate 110.

The first substrate 110 is configured to provide a process platform for forming the first device 150.

In this form, the first substrate 110 is a bulk substrate. In an example, the material of the first substrate is silicon. In some other forms, the first substrate may be alternatively a substrate made of another type of material.

For example, the first substrate may be made of other materials such as germanium, silicon germanium, silicon carbide, gallium arsenide, or indium gallium, and the first substrate may be alternatively another type of substrate such as a silicon-on-insulator substrate or a germanium-on-insulator substrate.

In an example, the first device structure 100 further includes: a first fin 111 protruding from the first substrate 110 and a first isolation layer 112 located on the first substrate 110 exposed from the first fin 111. A top portion of the first isolation layer 112 is flush with a top portion of the first fin 111.

In this form, the material of the first fin 111 is the same as the material of the first substrate 110.

The first isolation layer 112 is used as a shallow trench isolation (STI), and is configured to isolate adjacent transistors. The first isolation layer 112 may be made of silicon oxide, silicon nitride, or silicon oxynitride. In this form, the first isolation layer 112 is made of silicon nitride.

In this form, the first device 150 includes a first channel layer structure 120, a first device gate structure 130 extending across the first channel layer structure 120, and a first source-drain doping region 140 located in the first channel layer structure 120 on two sides of the first device gate structure 130.

The first channel layer structure 120 is configured to provide a channel of the first device 150.

In this form, the first channel layer structure 120 and the first substrate 110 are disposed at an interval. Specifically, the first channel layer structure 120 and the first fin 111 are disposed at an interval.

The first channel layer structure 120 includes one or more first channel layers 125 disposed at an interval in a normal direction on a surface of the first substrate 110. In an example, the first channel layer structure 120 includes one first channel layer 125.

In this form, the first device 150 is an NMOS device, and therefore, the first channel layer structure 120 is configured to provide a channel of the NMOS device, and the first channel layer structure 120 is made of silicon. In other forms, when the first device is a PMOS device, the first channel layer structure is correspondingly configured to provide a channel of the PMOS device, and the first channel layer structure is correspondingly made of germanium or silicon germanium.

It is to be noted that, in other forms, when the first device is a FinFET, the first channel layer structure is the first fin protruding from the first substrate. Correspondingly, the first isolation layer covers a part of a side wall of the first fin, and the top portion of the first isolation layer is lower than the top portion of the first fin.

FIG. 3 is a top view corresponding to the semiconductor structure shown in FIG. 2. To illustrate a corresponding position relationship between the first device 150 and the second device 350, FIG. 3 merely shows a first channel layer structure 120, a first device gate structure 130, a second channel layer structure 320, and a second device gate structure 330.

In this form, in a direction parallel to a surface of the first substrate 110, there are a plurality of first channel layer structures 120, the plurality of first channel layer structures 120 are arranged in parallel, and there is a first pitch P1 between adjacent first channel layer structures 120. The first pitch P1 is a sum of a line width of a first channel layer structure 120 and a space between adjacent first channel layer structures 120.

The first device gate structure 130 is located on the first isolation layer 112, the first device gate structure 130 is orthogonal to the first channel layer structure 120, and the first device gate structure 130 and the first channel layer structure 120 that are orthogonal to each other and a first source-drain doping region 140 located on two sides of the first device gate structure 130 are configured to form a first device 150.

The first device gate structure 130 is configured to control opening and closing of a channel of the first device 150.

In this form, the first device gate structure 130 is a metal gate (MG) structure. Therefore, the leakage current of a semiconductor device is reduced by using the MG structure. Accordingly, the first device gate structure 130 includes a first high-k gate dielectric layer (not shown in the figure), a first work function layer (not shown in the figure) located on the first high-k gate dielectric layer, and a first gate electrode layer (not shown in the figure) located on the first work function layer.

The material of the first high-k gate dielectric layer is a high-k dielectric material, and the high-k dielectric material is a dielectric material whose relative dielectric constant is greater than a relative dielectric constant of silicon oxide. Specifically, the material of the first high-k gate dielectric layer may be selected from $HfO_2$, $ZrO_2$, HfSiO, HfSiON, HfTaO, HfTiO, HfZrO, $Al_2O_3$, or the like. In an example, the first high-k gate dielectric layer is made of $HfO_2$.

The first work function layer is configured to adjust a threshold voltage of the first device 150. In this form, the first device 150 is an NMOS device, and correspondingly, the first work function layer is an N-type work function layer, and the material of the N-type work function layer includes one or more of TiAl, Mo, MoN, AlN, and TiAlC.

The first gate electrode layer is configured to lead out the electricity of the first device gate structure 130. In this form, the material of the first gate electrode layer is Al, Cu, Ag, Au, Pt, Ni, Ti, or W.

The first source-drain doping region 140 is used as a source region or a drain region of the first device 150. In this form, the first source-drain doping region 140 includes a first epitaxial layer doped with first type ions, and a conduction type of the first type is the same as the channel conduction type of the first device 150.

Specifically, the first device 150 is an NMOS device, and therefore, the first epitaxial layer is made of Si or SiC. The first type ions are N-type ions, and the N-type ions include P ions, As ions, or Sb ions. In an example, the first source-drain doping region 140 is made of SiP.

With reference to FIG. 4, in this form, the first device structure 100 further includes: a first interlayer dielectric layer 160, located on the first substrate 110 on a side portion of the first device gate structure 130, the first interlayer dielectric layer 160 covering a side wall of the first device gate structure 130.

The first interlayer dielectric layer 160 is configured to isolate adjacent first devices 150. The material of the first interlayer dielectric layer 160 is an insulation material, and the material includes one or more of silicon oxide, silicon nitride, silicon oxynitride, silicon oxycarbide, silicon carbonitride, and silicon oxy-carbonitride. In this form, the first interlayer dielectric layer 160 is made of silicon oxide.

In this form, a top portion of the first interlayer dielectric layer 160 is flush with a top portion of the first device gate structure 130.

Still referring to FIG. 4, in this form, the semiconductor structure further includes: a bottom source-drain plug 210, penetrating the first interlayer dielectric layer 160 above the first source-drain doping region 140, and connected to the first source-drain doping region 140.

The electricity of the first source-drain doping region 140 is led out through the bottom source-drain plug 210.

In this form, the source-drain plug connected to the first source-drain doping region 140 is used as a first source-drain plug, and the bottom source-drain plug 210 is used as a part of the first source-drain plug.

A second device structure 300 is stacked on the first device structure 100. Correspondingly, the first source-drain plug penetrates the second device structure 300 and the first interlayer dielectric layer 160 above the first source-drain doping region 140. The bottom source-drain plug 210 is disposed in the first device structure 100, so that in a forming process of the semiconductor structure, the first source-drain plug can be formed through two plug forming processes. That is, provided that a top source-drain plug penetrating the second device structures 300 and connected to the bottom source-drain plug 210 is formed after the second device structure 300 is stacked on the first device structure 100, the first source-drain plug is formed. The top source-drain plug and the bottom source-drain plug are configured to form the first source-drain plug, and therefore, an etching depth of a single plug forming process is reduced, thereby improving the profile quality and size accuracy of the first source-drain plug.

In this form, the bottom source-drain plug 210 is flush with the top portion of the first interlayer dielectric layer 160.

In this form, the bottom source-drain plug 210 is made of copper. Copper has a relatively low resistivity, thereby alleviating a signal delay of a back-end RC, improving a processing speed of a chip, further reducing resistance of the bottom source-drain plug 210, and correspondingly reducing power consumption. In other forms, the material of the bottom source-drain plug may be alternatively a conductive material such as tungsten or cobalt.

In this form, a surface, close to a top portion of the first device gate structure 130, in the first device structure 100 is a front surface 101, and the second device structure 300 is located on the front surface 101 of the first device structure 100, that is, the first device 150 and the second device 350 are located on the same side of the first substrate 110. Accordingly, an interconnection layout can be implemented on the same side of the first substrate 110, thereby reducing the circuit complexity and reducing the thickness of the semiconductor structure. Moreover, compared with the solution of stacking the first device and the second device on the same substrate, the first device 150 is formed on the first substrate 110, the second device 350 is formed on the second substrate 310, and the first device 150 and the second device 350 do not share the same device gate structure. Therefore, the first device 150 and the second device 350 are independent of each other, and the electrical isolation can still be implemented between the first device 150 and the second device 350. Correspondingly, the process flexibility of forming the first device 150 and the second device 350 is improved, making it easy for the first device 150 and the second device 350 to satisfy respective performance requirements.

In this form, the second device structure 300 is bonded to the front surface 101 of the first device structure 100. In a bonding manner, in the forming process of the semiconductor structure, finished products of the second substrate 310 and the first device structure 100 can be directly combined to reduce the process complexity and provide relatively high process feasibility.

Specifically, the semiconductor structure further includes: a bonding layer 200, located between the front surface 101 of the first device structure 100 and the second substrate 310. The bonding layer 200 facilitates bonding between the second substrate 310 and the first device structure 100, and provides relatively high bonding strength.

In this form, the material of the bonding layer 200 includes silicon oxide. The silicon oxide is used, so that the bonding between the second substrate 310 and the first device structure 100 can be implemented in a fusion bonding manner, thereby improving the bonding efficiency and the bonding strength between the first device structure 100 and the second device structure 300. Moreover, the electrical isolation effect between the first device 150 and the second device 350 is further improved. In addition, the silicon oxide is used, so that the bonding temperature is relatively low, and therefore, the impact on the performance of the first device 150 is reduced.

Specifically, the bonding layer 200 includes two stacked sub-bonding layers. One sub-bonding layer is located on the front surface 101 of the first device structure 100, and the other sub-bonding layer is located on a surface, facing the first device structure 100, of the second substrate 310. Therefore, the bonding between the second substrate 310 and the first device structure 100 is implemented through the bonding between the two sub-bonding layers. For example, both the two sub-bonding layers are made of silicon oxide, so as to implement silicon oxide-silicon oxide fusion bonding.

In this form, the second device structure 300 includes the second substrate 310 and the second device 350 formed on the second substrate 310.

The second substrate 310 is configured to provide a process platform for forming the second device 350.

In this form, the second substrate 310 is a thinned substrate. The thickness of the second substrate 310 is relatively small, so as to enable the thickness of the second substrate 310 to satisfy the performance requirements.

For detailed description of the second substrate 310, reference may be made to the corresponding description of the first substrate 110, and details are not described herein again.

In an example, the second device structure 300 further includes: a second fin 311 protruding from the second substrate 310 and a second isolation layer 312 located on the second substrate 310 exposed from the second fin 311. A top portion of the second isolation layer 312 is flush with a top portion the second fin 311.

For detailed description of the second fin 311 and the second isolation layer 312, reference may be respectively made to the corresponding description of the first fin 111 and the first isolation layer 112, as details are not described herein again.

In this form, the second device 350 includes a second channel layer structure 320 located on the second substrate 310, a second device gate structure 330 extending across the second channel layer structure 320, and a second source-drain doping region 340 located in the second channel layer structure 320 on two sides of the second device gate structure 330.

The second channel layer structure 320 is configured to provide a channel of the second device 350.

In this form, the second channel layer structure 320 and the second substrate 310 are disposed at an interval. Specifically, the second channel layer structure 320 and the second fin 311 are disposed at an interval.

The second channel layer structure 320 includes one or more second channel layers 325 disposed at an interval in a normal direction on a surface of the second substrate 310. In an example, the second channel layer structure 320 includes one second channel layer 325.

In this form, the second device 350 is a PMOS device, and therefore, the second channel layer structure 320 is configured to provide a channel of the PMOS device, and the second channel layer structure 320 is made of germanium or silicon germanium. Germanium or silicon germanium is used, thereby alleviating a problem of negative bias temperature instability (NBTI) of the PMOS transistor, so as to improve the performance of the PMOS transistor. In other forms, when the second device is an NMOS device, the second channel layer structure is correspondingly configured to provide a channel of the NMOS device, and the second channel layer structure is correspondingly made of silicon.

It is to be noted that, in other forms, the second device may be alternatively a FinFET, and the second channel layer structure is the second fin protruding from the second substrate. Correspondingly, the second isolation layer covers a part of a side wall of the second fin, and the top portion of the second isolation layer is lower than the top portion of the second fin.

In this form, projections of the second channel layer structure 320 and the first channel layer structure 120 onto the first substrate 110 intersect non-orthogonally. Correspondingly, projections of the second device gate structure 330 and the first device gate structure 130 onto the first substrate 110 also intersect non-orthogonally. Moreover, the first source-drain doping region 140 is located in the first channel layer structure 120 on two sides of the first device gate structure 130, and the second source-drain doping region 340 is located in the second channel layer structure 320 on two sides of the first device gate structure 330. Therefore, a probability that the second device 350 completely covers the first device 150 is relatively low, so that it is convenient to lead out the electricity of the first device 150.

Specifically, the projections of the second channel layer structure 320 and the first channel layer structure 120 onto the first substrate 110 intersect non-orthogonally, and therefore, the projection of the second channel layer structure 320 onto the first substrate 110 can expose a part of the projection of the first channel layer structure 120 onto the first substrate 110.

Correspondingly, the source-drain plug (that is, the first source-drain plug) connected to the first source-drain doping region 140 can be disposed in the region exposed from the second device 350 and penetrate the second device structure 300 and the first interlayer dielectric layer 160 above the top portion of the first source-drain doping region 140. Similarly, a gate plug connected to the top portion of the first device gate structure 130 can also be disposed in the region exposed from the second device 350 and penetrate the second device structure 300 above the top portion of the first device gate structure 130.

It is to be noted that, when there is an excessively large angle or an excessively small angle between the projections of the second channel layer structure 320 and the first channel layer structure 120 onto the first substrate 110, a covering region of the second device 350 on the first device 150 tends to be larger, making it more difficult to lead out the electricity of the first device 150. In view of this, in this form, an angle between the projections of the second channel layer structure 320 and the first channel layer structure 120 onto the first substrate 110 is 5° to 85°, and therefore, the projection of the second channel layer structure 320 onto the first substrate 110 can expose a part of the projection of the first channel layer structure 120 onto the first substrate 110.

In an example, the angle is 45°, so as to minimize the covering region of the second device 350 on the first device 150, and to provide sufficient process windows for forming the source-drain plug connected to the first source-drain doping region 140 and the gate plug connected to the first device gate structure 130.

Still referring to FIG. 3, in this form, in the second device structure 300, in a direction parallel to a surface of the second substrate 310, there are a plurality of second channel layer structures 320, the plurality of second channel layer structures 320 are arranged in parallel, and there is a second pitch P2 between adjacent second channel layer structures 320. The second pitch P2 is a sum of a line width of a second channel layer structure 320 and a space between adjacent second channel layer structures 320.

In this form, the second pitch P2 is not equal to the first pitch P1. That is, the second pitch P2 is less than the first pitch P1, or, the second pitch P2 is greater than the first pitch P1. Because the second pitch P2 is not equal to the first pitch P1, the covering region of the second device 350 on the first device 150 is further reduced.

It is to be noted that, an absolute value of a difference between the second pitch P2 and the first pitch P1 should not be excessively small or excessively large. If the absolute value of the difference is excessively small, the second pitch P2 is excessively close to the first pitch P1, and the covering region of the second device 350 on the first device 150 tends to be larger, or even the second device 350 tends to completely cover the first device 150, resulting in increased process difficulty in leading out the electricity of the first device 150. If the absolute value of the difference is excessively large, a problem of an excessively large second pitch P2 or an excessively large first pitch P1 tends to occur, resulting in an excessively large overall area of the semiconductor structure. Moreover, as the pitch increases, the volume of an epitaxial layer corresponding to the source-drain doping region increases accordingly. Correspondingly, if the absolute value of the difference is excessively large, there is likely an excessively large difference between the volumes of epitaxial layers corresponding to the first source-drain doping region 140 and the second source-drain doping region 340, and therefore, a problem of a mismatch between the performance of the first device 150 and the performance of the second device 350 tends to occur. In view of this, in this form, the absolute value of the difference between the second pitch P2 and the first pitch P1 is 1 nm to 5 nm. For example, the absolute value of the difference between the second pitch P2 and the first pitch P1 is 2 nm, 3 nm, or 4 nm.

The second device gate structure 330 is located on the second isolation layer 312, the second device gate structure 330 is orthogonal to the second channel layer structure 320, and the second device gate structure 330 and the second channel layer structure 320 that are orthogonal to each other and a second source-drain doping region 340 located on two sides of the second device gate structure 330 are configured to form a second device 350.

The second device gate structure 330 is configured to control opening and closing of a channel of the second device 350.

In this form, the second device gate structure 330 is an MG structure, and the second device gate structure 330 includes a second high-k gate dielectric layer (not shown in the figure), a second work function layer (not shown in the figure) located on the second high-k gate dielectric layer, and a second gate electrode layer (not shown in the figure) located on the second work function layer.

For detailed description of the second high-k gate dielectric layer and the second gate electrode layer, reference may be respectively made to the corresponding description of the first high-k gate dielectric layer and the first gate electrode layer, as details are not described herein again.

The second work function layer is configured to adjust a threshold voltage of the second device 350. In this form, the second device 350 is a PMOS device, and the second work function layer is a P-type work function layer. The material of the P-type work function layer includes one or more of TiN, TaN, TaSiN, TaAlN, and TiAlN.

The second source-drain doping region 340 is used as a source region or a drain region of the second device 350. In this form, the second source-drain doping region 340 includes a second epitaxial layer doped with second type ions, and a conduction type of the second type is the same as the channel conduction type of the second device 350.

Specifically, the second device 350 is a PMOS device, and therefore, the material of the second epitaxial layer is Si or SiGe. The second type ions are P-type ions, and the P-type ions include B ions, Ga ions, or In ions. In an example, the second source-drain doping region 340 is made of SiGeB.

With reference to FIG. 4 and FIG. 5, in this form, the second device structure 300 further includes: a second interlayer dielectric layer 360, located on the second substrate 310 on a side portion of the second device gate structure 330, the second interlayer dielectric layer 360 covering a side wall of the second device gate structure 330.

The second interlayer dielectric layer 360 is configured to isolate adjacent second devices 350. In this form, the second interlayer dielectric layer 360 is made of silicon oxide, and a top portion of the second interlayer dielectric layer 360 is flush with a top portion of the second device gate structure 330. For detailed description of the second interlayer dielectric layer 360, reference may be made to the corresponding description of the first interlayer dielectric layer 160, and details are not described herein again.

As shown in FIG. 4, the semiconductor structure further includes: a top source-drain plug 220, penetrating the second interlayer dielectric layer 360 and the second substrate 310 above the first source-drain doping region 140, and connected to the bottom source-drain plug 210. The top source-drain plug 220 and the bottom source-drain plug 210 are configured to form a first source-drain plug 230.

The top source-drain plug 220 is electrically connected to the first source-drain doping region 140 by the bottom source-drain plug 210, and therefore, the first source-drain plug 230 is configured to lead out the electricity of the first source-drain doping region 140.

In this form, a top portion of the top source-drain plug 220 is flush with a top portion of the second interlayer dielectric layer 360, and the top source-drain plug 220 is made of copper.

It is to be noted that, in other forms, the top source-drain plug and the bottom source-drain plug may be alternatively an integral structure, so as to improve the alignment precision of forming the first source-drain plug.

As shown in FIG. 5, the semiconductor structure further includes: a second source-drain plug 240, penetrating the second interlayer dielectric layer 360 above the second source-drain doping region 340, and connected to the second source-drain doping region 340.

The second source-drain plug 240 is configured to lead out the electricity of the second source-drain doping region 340. In this form, a top portion of the second source-drain plug 240 is flush with the top portion of the second interlayer dielectric layer 360, and the second source-drain plug 240 is made of copper. For detailed description of the top source-drain plug 220 and the second source-drain plug 240, reference may be made to the corresponding description of the bottom source-drain plug 210, and details are not described herein again.

Accordingly, the present disclosure further provides a forming method of a semiconductor structure.

FIG. 6 to FIG. 16 are schematic structural diagrams corresponding to steps in one form of a forming method of a semiconductor structure according to the present disclosure.

Figure 6:
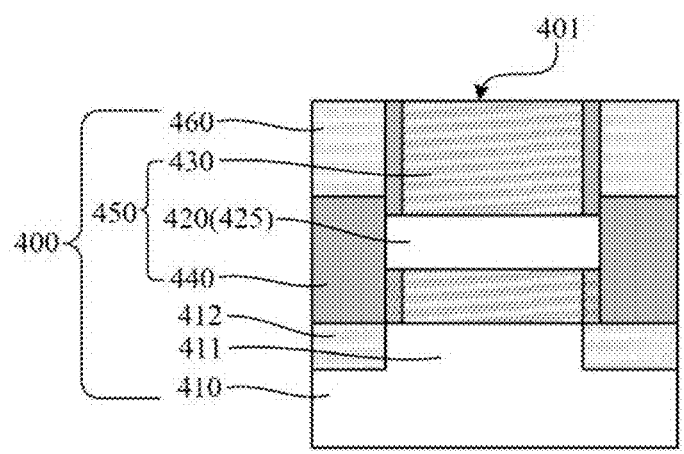
FIG. 6 to FIG. 16 are schematic structural diagrams corresponding to steps in one form of a forming method of a semiconductor structure according to the present disclosure.
Figure 7:
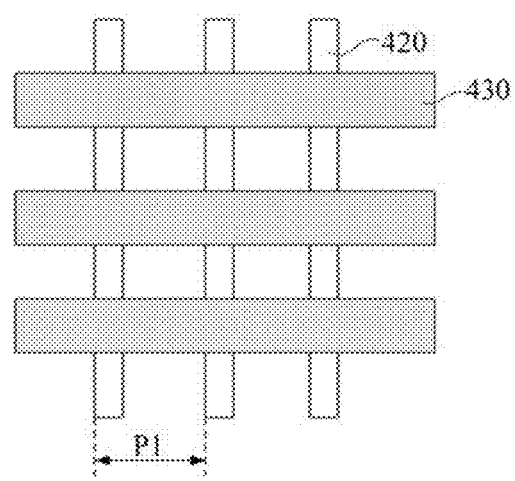

With reference to FIG. 6 and FIG. 7, FIG. 7 is a top view of FIG. 6. The method includes: forming a first device structure 400, including a first substrate 410 and a first device 450 formed on the first substrate 410, the first device 450 including a first channel layer structure 420 located on the first substrate 410, a first device gate structure 430 extending across the first channel layer structure 420, and a first source-drain doping region 440 located in the first channel layer structure 420 on two sides of the first device gate structure 430, a surface, close to a top portion of the first device gate structure 430, in the first device structure 400 being a front surface 401.

For ease of illustration, FIG. 7 merely shows a corresponding position relationship between the first channel layer structure 420 and the first device gate structure 430.

In this form, the forming method is used for forming the CFET. Therefore, a second device structure having a second device is formed above the first device structure 400 subsequently, to enable the first device 450 and the second device to be stacked vertically, so as to save area, and improve the transistor integration density, thereby bringing advantages in power consumption and price-performance ratio.

The first substrate 410 is configured to provide a process platform for forming the first device 450. In an example, the formed first device 450 is a GAA transistor.

In this form, the first substrate 410 is a bulk substrate. In an example, the material of the first substrate is silicon.

In some other forms, the first substrate may be alternatively a substrate made of another type of material. For example, the first substrate may be made of other materials such as germanium, silicon germanium, silicon carbide, gallium arsenide, or indium gallium, and the first substrate may be alternatively another type of substrate such as a silicon-on-insulator substrate or a germanium-on-insulator substrate.

In this form, the first substrate 410 is further formed with a first fin 411 and a first isolation layer 412 located on the first substrate 410 exposed from the first fin 411. A top portion of the first isolation layer 412 is flush with a top portion the first fin 411. For detailed description of the first substrate 410, the first fin 411, and the first isolation layer 412, reference may be made to the corresponding description in the foregoing embodiments. Details are not described herein again.

In this form, the first device 450 includes a first channel layer structure 420, a first device gate structure 430 extending across the first channel layer structure 420, and a first source-drain doping region 440 located in the first channel layer structure 420 on two sides of the first device gate structure 430.

Specifically, with reference to FIG. 7, the first device gate structure 430 is orthogonal to the first channel layer structure 420, and the first device gate structure 430 and the first channel layer structure 420 that are orthogonal to each other and a first source-drain doping region 440 located on two sides of the first device gate structure 430 are configured to form a first device 450.

The first channel layer structure 420 is configured to provide a channel of the first device 450.

In this form, the first channel layer structure 420 and the first substrate 410 are disposed at an interval. Specifically, the first channel layer structure 420 and the first fin 411 are disposed at an interval.

The first channel layer structure 420 includes one or more first channel layers 425 disposed at an interval in a normal direction on a surface of the first substrate 410. In an example, the first channel layer structure 420 includes one first channel layer 425.

In this form, the first device 450 is an NMOS device, and therefore, the first channel layer structure 420 is configured to provide a channel of the NMOS device, and the first channel layer structure 420 is made of silicon.

In other forms, when the first device is a PMOS device, the first channel layer structure is correspondingly configured to provide a channel of the PMOS device, and the first channel layer structure may be correspondingly made of germanium or silicon germanium.

Still referring to FIG. 7, in this form, in a direction parallel to a surface of the first substrate 410, there are a plurality of first channel layer structures 420, the plurality of first channel layer structures 420 are arranged in parallel, and there is a first pitch P1 between adjacent first channel layer structures 420.

The first device gate structure 430 is located on the first isolation layer 412. The first device gate structure 430 is configured to control opening and closing of a channel of the first device 450.

In this form, the first device gate structure 430 is an MG structure, and the first device gate structure 430 includes a first high-k gate dielectric layer (not shown in the figure), a first work function layer (not shown in the figure) located on the first high-k gate dielectric layer, and a first gate electrode layer (not shown in the figure) located on the first work function layer.

For detailed description of the first high-k gate dielectric layer, the first work function layer, and the first gate electrode layer, reference may be made to the corresponding description in the foregoing implementations as details are not described herein again.

In this form, the first source-drain doping region 440 includes a first epitaxial layer doped with first type ions, and a conduction type of the first type is the same as the channel conduction type of the first device 450. Specifically, the first device 450 is an NMOS device, and therefore, the first epitaxial layer is made of Si or SiC. The first type ions are N-type ions, and the N-type ions include P ions, As ions, or Sb ions.

In this form, the first device structure 400 further includes: a first interlayer dielectric layer 460, located on the first substrate 410 on a side portion of the first device gate structure 430, the first interlayer dielectric layer 460 covering a side wall of the first device gate structure 430.

The first interlayer dielectric layer 460 is configured to isolate adjacent first devices 450. The material of the first interlayer dielectric layer 460 is an insulation material, and the material includes at least one of silicon oxide, silicon nitride, silicon oxynitride, silicon oxycarbide, silicon carbonitride, or silicon oxy-carbonitride. In this form, the first interlayer dielectric layer 460 is made of silicon oxide.

In this form, a top portion of the first interlayer dielectric layer 460 is flush with a top portion of the first device gate structure 430.

In this form, the first device gate structure 430 is formed using a process of forming a high-k gate dielectric layer last or forming a gate electrode layer last (high k last/metal gate last). Therefore, before the first device gate structure 430 is formed, the position of the first device gate structure 430 is occupied by a first dummy gate structure.

Specifically, the step of forming a first device structure 400 includes: forming one or more stacked first channel stacks on the first substrate 410, each first channel stack including a first sacrificial layer (not shown in the figure) and a first channel layer 425 located on the first sacrificial layer; forming a first dummy gate structure extending across the first channel stack, the first dummy gate structure covering a part of a top portion and a part of a side wall of the first channel stack; forming first source-drain doping region 440 in the first channel stacks on two sides of the first dummy gate structure; forming a first interlayer dielectric layer 460 on the first substrate 410 on a side portion of the first dummy gate structure, the first interlayer dielectric layer 460 covering the first source-drain doping region 440; removing the first dummy gate structure, and forming a first gate opening (not shown in the figure) in the first interlayer dielectric layer 460; removing a sacrificial layer exposed from the first gate opening, and forming a first through groove (not shown in the figure) in communication with the first gate opening; and forming a first device gate structure 430 in the first gate opening and the first through groove, the first device gate structure 430 surrounding the first channel layer 425.

Therefore, in this form, the first channel layer 425 and the first fin 411 that are located at the bottom are disposed at an interval.

In this form, before the first source-drain doping region 440 is formed, the step of forming a first device structure 400 further includes: forming a first spacer (not shown) on a side wall of the first dummy gate structure, the first spacer being configured to protect the side wall of the first dummy gate structure, and being further configured to be used as a mask for forming the first source-drain doping region 440. In an example, the first spacer is made of silicon.

In this form, before the first source-drain doping region 440 is formed, the step of forming a first device structure 400 further includes: etching the first channel stack on two sides of the first dummy gate structure using the first spacer as a mask, and forming a groove in the first channel stack, the groove exposing the first sacrificial layer and the side wall of the first channel layer 425. Correspondingly, the step of forming the first source-drain doping region 440 includes: forming a first epitaxial layer in the groove by using an epitaxial process, and self-doping first type ions in situ during epitaxy, the first epitaxial layer doped with the first type ions being used as the first source-drain doping region 440.

It is to be noted that, after the groove is formed and before the first source-drain doping region 440 is formed, the step of forming a first device structure 400 further includes: laterally etching, in a direction perpendicular to the side wall of the dummy gate structure, a part of first sacrificial layer exposed from the groove, to enable the side wall of the remaining first sacrificial layer to indent inward the side wall of the first channel layer 425 to form a trench, where the trench is enclosed by adjacent first channel layers 425 and the remaining first sacrificial layer, or is enclosed by a first channel layer 425 closest to the first substrate 410, the first substrate 410, and the remaining first sacrificial layer; and forming a first inner spacer (not shown) in the trench.

The first inner spacer is used, to reduce the parasitic capacitance between the first device gate structure 430 and the first source-drain plug, so as to improve the device performance. The first source-drain plug is a contact plug electrically connected to the first source-drain doping region 440.

It is to be noted that, in other forms, the first device may be alternatively a FinFET. Correspondingly, the first channel layer structure is the first fin protruding from the first substrate. Correspondingly, the first isolation layer covers a part of a side wall of the first fin, and the top portion of the first isolation layer is lower than the top portion of the first fin.

When the first device is the FinFET, in the step of forming the first dummy gate structure, the first dummy gate structure extends across the first fin, and covers a part of a top portion and a part of a side wall of the first fin. Correspondingly, the first device gate structure is only formed in the first gate opening. The step of forming the FinFET is similar to the step of forming the GAA transistor, which is not described in this form.

Figure 8:
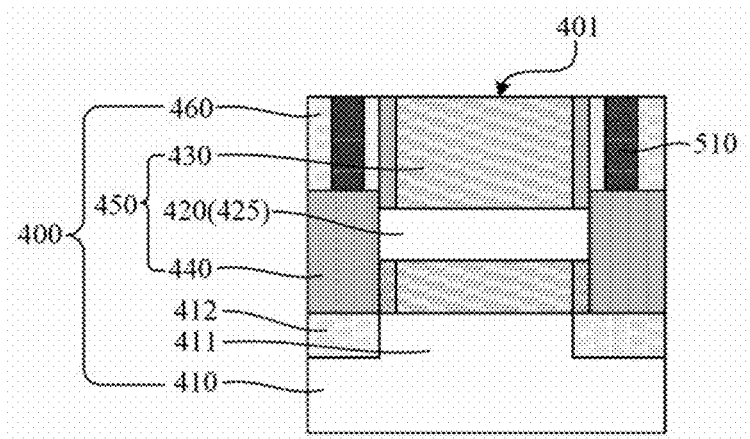

With reference to FIG. 8, the forming method further includes: forming a bottom source-drain plug 510 penetrating the first interlayer dielectric layer 460 above the first source-drain doping region 440, the bottom source-drain plug 510 being connected to the first source-drain doping region 440.

The bottom source-drain plug 510 is configured to lead out the electricity of the first source-drain doping region 440. Specifically, the bottom source-drain plug 510 is configured to be used as a part of the first source-drain plug.

Subsequently, a second device structure is stacked on the first device structure 400, and the electricity of the first source-drain doping region 440 is led out through the first source-drain plug. Correspondingly, the first source-drain plug penetrates the second device structure and the first interlayer dielectric layer 460 above the first source-drain doping region 440. Therefore, the bottom source-drain plug 510 is formed first and the second device structure is stacked on the first device structure 400 subsequently, only a top source-drain plug penetrating the second device structure and connected to the bottom source-drain plug 510 needs to be formed. The top source-drain plug and the bottom source-drain plug are configured to form the first source-drain plug. The first source-drain plug is formed through two plug forming processes, to reduce an etching depth of a single plug forming process, thereby improving the controllability of each etching process, to help improve the profile quality and size accuracy of the first source-drain plug.

Specifically, the first interlayer dielectric layer 460 above the first source-drain doping region 440 is etched, to from a contact hole exposing the first source-drain doping region 440; a conductive material is filled into the contact hole; and the conductive material is planarized, to enable a top portion of the remaining conductive materials to be flush with the top portion of the first interlayer dielectric layer 460, and the remaining conductive material after planarization is used as the bottom source-drain plug 510.

In this form, the bottom source-drain plug 510 is made of copper. In other forms, the material of the bottom source-drain plug may be alternatively a conductive material such as tungsten or cobalt.

After the first device structure 400 is formed, a surface, close to a top portion of the first device gate structure 430, in the first device structure 400 is a front surface 401. In an example, the front surface 401 exposes the top portion of the first device gate structure 430.

The front surface 401 is configured to provide a process platform for forming a subsequent second device structure.

Figure 9:
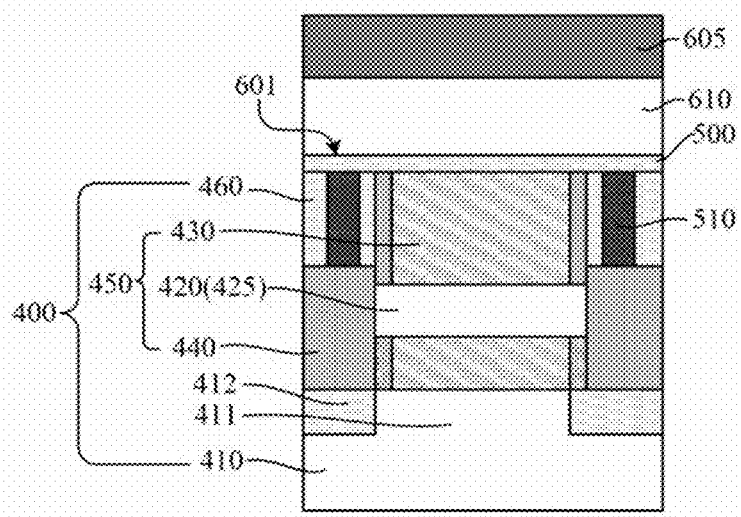

Referring to FIG. 9, a second substrate 610 is formed on the front surface 401 of the first device structure 400.

The second substrate 610 is configured to provide a process platform for subsequently forming the second device.

Moreover, the second substrate 610 is used as a part of the second device structure. The second substrate 610 is disposed on the front surface 401 of the first device structure 400, the second device structure can be stacked on the front surface 401 of the first device structure 400.

Compared with the solution of forming the stacked first device and second device on the same substrate, in this form, after the first device structure 400 is formed, a second substrate 610 is disposed on a front surface 401 of the first device structure 400, so as to separately manufacture a first device 450 on the first substrate 410 and manufacture a second device on the second substrate 610. The first device 450 and the second device do not share the same device gate structure, and therefore, the first device 450 and the second device are independent of each other, and the electrical isolation can still be implemented between the first device 450 and the second device. Correspondingly, the process flexibility of forming the first device 450 and the second device is improved, making it easy for the first device 450 and the second device to satisfy respective performance requirements. Moreover, after the second device is formed on the second substrate 610 subsequently, the first device 450 and the second device are located on the same side of the first substrate 410. Accordingly, an interconnection layout can be implemented on the same side of the first substrate 410 subsequently, thereby reducing the circuit complexity and reducing the thickness of the semiconductor structure.

For detailed description of the second substrate 610, reference may be made to the corresponding description of the first substrate 410 as details are not described herein again.

In this form, the step of forming the second substrate 610 on the front surface 401 of the first device structure 400 includes: providing a second substrate 610; bonding the second substrate 610 to the front surface 401 of the first device structure 400.

In a bonding manner, finished products of the second substrate 310 and the first device structure 100 can be directly combined to reduce the process complexity and provide relatively high process feasibility.

In this form, the second substrate 610 is bonded to the front surface 401 of the first device structure 400 by a bonding layer 500. The bonding layer 500 facilitates bonding between the second substrate 610 and the first device structure 400, and provides relatively high bonding strength.

In this form, the material of the bonding layer 500 includes silicon oxide. The silicon oxide is used, so that the bonding between the second substrate 610 and the first device structure 400 can be implemented in a fusion bonding manner, thereby improving the bonding efficiency and the bonding strength between the second substrate 610 and the first device structure 400. Moreover, the electrical isolation effect between the first device 450 and the second device is further improved. In addition, the silicon oxide is used, so that the bonding temperature is relatively low, and therefore, the impact on the performance of the first device 450 is reduced.

In this form, the second substrate 610 includes a to-be-bonded surface 601 configured to be bonded to the first device structure 400. A first sub-bonding layer (not shown) is formed on the front surface 401 of the first device structure 400. After a second sub-bonding layer (not shown) is formed on the to-be-bonded surface 601, the first sub-bonding layer is enabled to be bonded to the second sub-bonding layer, so as to implement the bonding between the second substrate 610 and the first device structure 400. Correspondingly, the first sub-bonding layer and the second sub-bonding layer form a bonding layer 500 of a stacked structure.

In this form, both the first sub-bonding layer and the second sub-bonding layer are made of silicon oxide, so as to implement silicon oxide-silicon oxide fusion bonding.

In this form, the first sub-bonding layer and the second sub-bonding layer are formed by using a deposition process (for example, a chemical vapor deposition process).

In this form, a surface, opposite to the to-be-bonded surface 601, in the second substrate 610 is further formed with a channel material layer 605. The channel material layer 605 is configured to form the second channel layer structure.

In this form, the second device formed subsequently is a PMOS device, and therefore, the channel material layer 605 is made of germanium or silicon germanium. In other forms, when the second device is an NMOS device, the channel material layer may be correspondingly made of silicon.

Specifically, the second substrate 610 is formed with one or more stacked channel material stacks (not shown in the figure). Each channel material stack includes a sacrificial material layer (not shown in the figure) and the channel material layer 605 located on the sacrificial material layer. In an example, there is one channel material stack.

The sacrificial material layer is configured to form a second sacrificial layer. The channel material layer 605 is configured to form a second channel layer structure.

Therefore, in an actual forming process, a sacrificial material layer is further formed between the second substrate 610 and the channel material layer 605. It is to be noted that, the sacrificial material layer is not illustrated in FIG. 10 according to this implementation.

In this form, the channel material layer 605 is made of germanium or silicon germanium, and correspondingly, the sacrificial material layer is made of silicon. An etching selection ratio between the sacrificial material layer and the channel material layer 605 is relatively high, so as to reduce the damage to the second channel layer in a subsequent process of removing the second sacrificial layer. In other forms, when the channel material layer is made of silicon, the sacrificial material layer is made of SiGe correspondingly.

It is further to be noted that, a fin material layer (not shown in the figure) is further formed on a surface of the second substrate 610, and the fin material layer is configured to form the second fin. In an example, the second substrate 610 and the fin material layer are an integral structure.

In other forms, when the formed second device is a FinFET, the channel material layer is the fin material layer, and the fin material layer is directly formed on the second substrate. Specifically, the fin material layer and the second substrate may be an integral structure.

In addition, in this form, the forming method further includes: thinning the second substrate 610.

The second substrate 610 is provided by a barewafer, and the thickness of the barewafer is generally large. Therefore, the second substrate 610 is thinned to enable a final thickness of the second substrate 610 to satisfy the performance requirements of the second device. For example, the heat dissipation effect of the device is improved, the subsequent encapsulation procedure is facilitated, and an overall thickness of the encapsulated structure after the encapsulation is reduced.

The second substrate 610 may be thinned before being bonded to the front surface 401 of the first device structure 400. Alternatively, the second substrate 610 may be thinned after being bonded to the front surface 401 of the first device structure 400.

In an example, a surface, opposite to the to-be-bonded surface 601, of the second substrate 610 is thinned after the second substrate 610 is bonded to the front surface 401 of the first device structure 400.

In this form, the second substrate 610 and the fin material layer are an integral structure, and the fin material layer has a preset thickness. Correspondingly, a top surface of the fin material layer is thinned, and after the thinning, the thickness of the second substrate 610 satisfies the process requirements while the thickness of the fin material layer reaches the preset thickness.

Specifically, the thinning may be performed in a polishing manner.

In some other forms, alternatively, a stop region may be formed in the barewafer using neutral doping ions (for example, one or two of oxygen ions and nitrogen ions), so as to enable the stop region to be configured to define a stop position of the thinning.

In other forms, when the second substrate is a silicon-on-insulator substrate or a germanium-on-insulator substrate, the to-be-bonded surface of the second substrate may be alternatively thinned and stopped at a bottom of the insulator before the second substrate is bonded to the surface of the first device structure.

Figure 10:
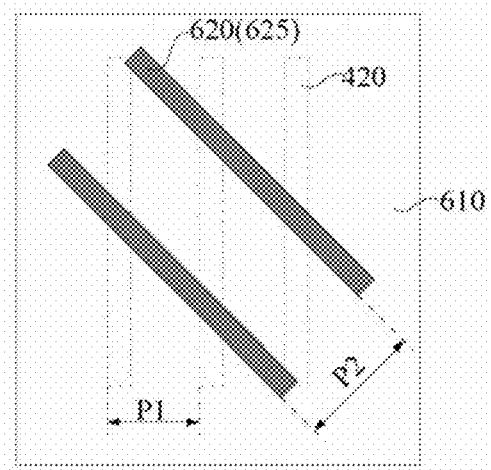

With reference to FIG. 10, FIG. 10 is a top view. After the second substrate 610 (as shown in FIG. 9) is disposed on the front surface 401 (as shown in FIG. 9) of the first device structure 400 (as shown in FIG. 9), a second channel layer structure 620 is formed on the second substrate 610, and projections of the second channel layer structure 620 and the first channel layer structure 420 onto the first substrate 410 intersect non-orthogonally.

A contour of the first channel layer structure 420 is represented in a dashed box, and for ease of illustration, only the first channel layer structure 420, the second channel layer structure 620, and the second substrate 610 are illustrated.

The second channel layer structure 620 is configured to provide a channel of the second device.

In this form, the second channel layer structure 620 and the second substrate 610 are disposed at an interval.

Specifically, the step of forming the second channel layer structure 620 includes: patterning the channel material stack, patterning the sacrificial material layer into a second sacrificial layer (not shown in the figure), and patterning the channel material layer 605 into a second channel layer 625. Therefore, after the channel material stack is patterned, one or more stacked second channel stacks are formed. Each second channel stack includes the second sacrificial layer (not shown in the figure) and the second channel layer 625 located on the second sacrificial layer.

In this form, in a normal direction of a surface of the second substrate 610, a quantity of the channel material stacks is one, and correspondingly, there is one second channel stacks. Therefore, the second channel layer 625 is the second channel layer structure 620.

In other forms, in a normal direction of a surface of the second substrate, when there are a plurality of channel material stacks, there are a plurality of second channel stacks correspondingly. The second channel layer structure correspondingly includes a plurality of second channel layers disposed at an interval in the normal direction of the surface of the second substrate. Adjacent second channel layers are isolated by the second sacrificial layer.

In this form, in a process of patterning the channel material stack, a fin material layer is further patterned. A second fin (not shown in the figure) located between the top portion of the second substrate 610 and the bottom of the second channel layer structure 620 is formed. Correspondingly, the second channel layer structure 620 and the second fin are disposed at an interval.

It is to be noted that, the second fin is located under the second channel layer structure 620, and therefore, the second fin is not shown in FIG. 10.

In other forms, when the formed second device is a FinFET, the channel material layer is the fin material layer, and the second channel layer structure correspondingly is the second fin protruding from the second substrate.

It is to be noted that, after the second channel layer structure 620 is formed, the forming method further includes: forming a second isolation layer (not shown in the figure) on the second substrate 610 exposed from the second channel layer structure 620. In this form, a top portion of the second isolation layer is flush with a top portion of the second fin.

It is to be noted that, the second isolation layer is not shown in FIG. 10.

In this form, projections of the second channel layer structure 620 and the first channel layer structure 420 onto the first substrate 410 intersect non-orthogonally.

Subsequently, a second device gate structure extending across the second channel layer structure 620 is formed, and a second source-drain doping region is formed in the second channel layer structure 620 on two sides of the second device gate structure. The second device gate structure and the second channel layer structure 620 that are orthogonal to each other and the second source-drain doping region located on two sides of the second device gate structure are configured to form a second device. The second device and the second substrate are configured to form a second device structure. Because projections of the first device gate structure 430 and the first channel layer structure 420 onto the first substrate 410 are orthogonal, and projections of the second device gate structure and the second channel layer structure 620 onto the second substrate 610 are orthogonal, correspondingly, projections of the second device gate structure and the first device gate structure 430 onto the first substrate 410 intersect non-orthogonally. Therefore, a probability that the second device completely covers the first device 450 is relatively low, so that it is convenient to lead out the electricity of the first device 450.

Specifically, the projections of the second channel layer structure 620 and the first channel layer structure 420 onto the first substrate 410 intersect non-orthogonally, and therefore, the projection of the second channel layer structure 620 onto the first substrate 410 can expose a part of the projection of the first channel layer structure 420 onto the first substrate 410.

Correspondingly, when a source-drain plug electrically connected to the first source-drain doping region 440 is subsequently formed, the source-drain plug can be formed in the region exposed from the second device and penetrate the second device structure and the first interlayer dielectric layer 460 above the top portion of the first source-drain doping region 440. Similarly, when a gate plug connected to the top portion of the first device gate structure 430 is formed, the gate plug can also be disposed in the region exposed from the second device and penetrate the second device structure above the top portion of the first device gate structure 430.

It is to be noted that, when there is an excessively large angle or an excessively small angle between the projections of the second channel layer structure 620 and the first channel layer structure 420 onto the first substrate 410, a covering region of the second device on the first device 450 tends to be larger, making it more difficult to lead out the electricity of the first device 450. In view of this, in this form, an angle between the projections of the second channel layer structure 620 and the first channel layer structure 420 onto the first substrate 410 is 5° to 85°.

In an example, the angle is 45°, so as to minimize the covering region of the second device on the first device 450, and to provide sufficient process windows for forming the source-drain plug connected to the first source-drain doping region 440 and the gate plug connected to the first device gate structure 430.

In this form, in a direction parallel to a surface of the second substrate 610, there are a plurality of second channel layer structures 620, the plurality of second channel layer structures 620 are arranged in parallel, and there is a second pitch P2 between adjacent second channel layer structures 620. The second pitch P2 is a sum of a line width of a second channel layer structure 620 and a space between adjacent second channel layer structures 620.

In this form, the second pitch P2 is not equal to the first pitch P1. Because the second pitch P2 is not equal to the first pitch P1, the covering region of the second device on the first device 450 is further reduced.

It is to be noted that, an absolute value of a difference between the second pitch P2 and the first pitch P1 should not be excessively small or excessively large. If the absolute value of the difference is excessively small, the second pitch P2 is excessively close to the first pitch P1, and the covering region of the second device on the first device 450 tends to be larger, or even the second device tends to completely cover the first device 450, resulting in increased process difficulty in leading out the electricity of the first device 450. If the absolute value of the difference is excessively large, a problem of an excessively large second pitch P2 or an excessively large first pitch P1 tends to occur, resulting in an excessively large overall area of the semiconductor structure. Moreover, as the pitch increases, the volume of an epitaxial layer corresponding to the source-drain doping region increases accordingly. Correspondingly, if the absolute value of the difference is excessively large, there is likely an excessively large difference between the volumes of epitaxial layers corresponding to the first source-drain doping region 440 and the second source-drain doping region, and therefore, a problem of a mismatch between the performance of the first device 450 and the performance of the second device tends to occur.

In view of this, in this form, the absolute value of the difference between the second pitch P2 and the first pitch P1 is 1 nm to 5 nm.

With reference to FIG. 11 to FIG. 14, a second device gate structure 630 and a second source-drain doping region 640 are formed on the second substrate 610. A second device gate structure 630 extends across the second channel layer structure 620, and the second source-drain doping region 640 is located in the second channel layer structure 620 on two sides of the second device gate structure 630. The second source-drain doping region 640, the second device gate structure 630, and the second channel layer structure 620 are configured to form a second device 650. The second device 650 and the second substrate 610 are configured to form a second device structure 600.

Figure 11:
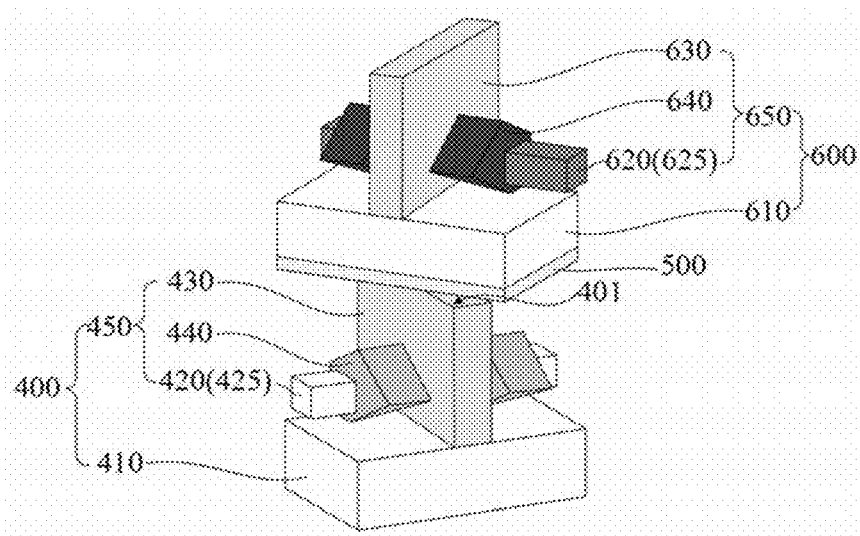
Figure 12:
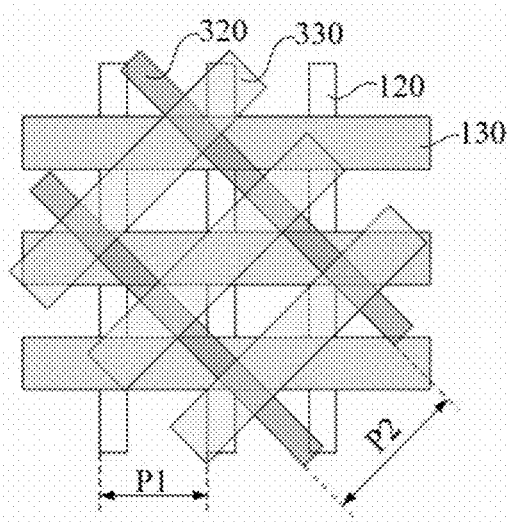
Figure 13:
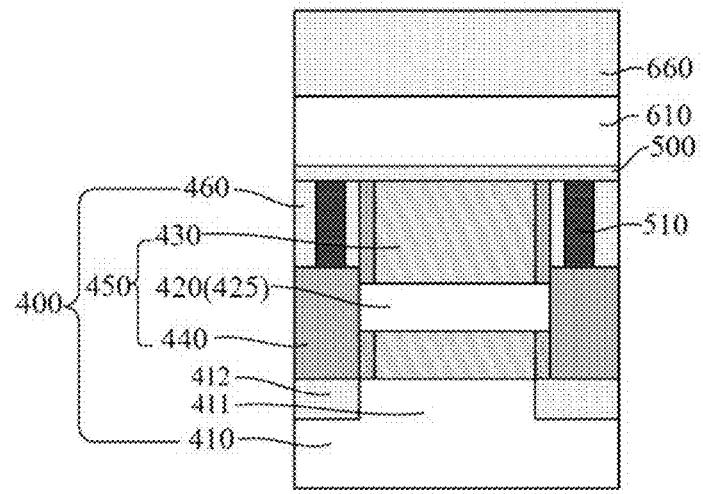
Figure 14:
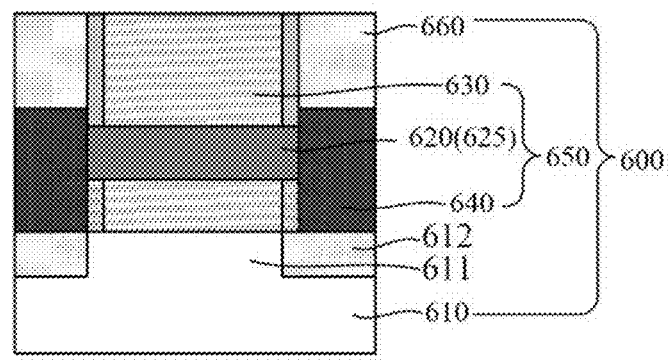

FIG. 11 is a three-dimensional diagram. FIG. 12 is a top view of FIG. 11. FIG. 13 is a cross-sectional view of the semiconductor structure shown in FIG. 11 at a location where a second device 600 is exposed and in an extending direction of a first channel layer structure 425. FIG. 14 is a cross-sectional view of the second device structure 600 shown in FIG. 11 in an extending direction of the second channel layer structure 625. Moreover, to illustrate a corresponding position relationship between the first device 450 and the second device 650, FIG. 12 merely shows a first channel layer structure 420, a first device gate structure 430, a second channel layer structure 620, and a second device gate structure 630.

The second device gate structure 630 and the second channel layer structure 620 that are orthogonal to each other and a second source-drain doping region 640 located on two sides of the second device gate structure 630 are configured to form a second device 650.

The second device gate structure 630 and the second source-drain doping region 640 are formed on the second substrate 610, the second device 650 stacked above the first device 450 is further formed. Specifically, the second device gate structure 630 is formed on the second isolation layer 312.

The second device gate structure 630 is configured to control opening and closing of a channel of the second device 650.

In this form, the second device gate structure 630 is an MG structure. Accordingly, the second device gate structure 630 includes a second high-k gate dielectric layer (not shown in the figure), a second work function layer (not shown in the figure) located on the second high-k gate dielectric layer, and a second gate electrode layer (not shown in the figure) located on the second work function layer. For detailed description of the second high-k gate dielectric layer and the second gate electrode layer, reference may be respectively made to the corresponding description of the first high-k gate dielectric layer and the first gate electrode layer, and details are not described herein again.

The second work function layer is configured to adjust a threshold voltage of the second device 650. In this form, the second device 650 is a PMOS device, and the second work function layer is a P-type work function layer. The material of the P-type work function layer includes at least one of TiN, TaN, TaSiN, TaAlN, or TiAlN. In this form, the second source-drain doping region 640 includes a second epitaxial layer doped with second type ions. Specifically, the second device 650 is a PMOS device, and therefore, the material of the second epitaxial layer is Si or SiGe. The second type ions are P-type ions, and the P-type ions include B ions, Ga ions, or In ions.

In this form, the forming method of a semiconductor structure further includes: forming a second interlayer dielectric layer 660 on the second substrate 610. The second interlayer dielectric layer 660 is located on the second substrate 610 on a side portion of the second device gate structure 630, and covers a side wall of the second device gate structure 630. The second interlayer dielectric layer 660, the second device 650, and the second substrate 610 are configured to form the second device structure 600.

The second interlayer dielectric layer 660 is configured to isolate adjacent second devices 650. In this form, the second interlayer dielectric layer 660 is flush with a top portion of the second device gate structure 630. For detailed description of the second interlayer dielectric layer 660, reference may be made to the corresponding description of the first interlayer dielectric layer 460 as details are not described herein again.

In this form, the second device gate structure 630 is formed using a process of forming a high-k gate dielectric layer last or forming a gate electrode layer last. Therefore, before the second device gate structure 630 is formed, the position of the second device gate structure 630 is occupied by a second dummy gate structure.

Specifically, the step of forming the second device structure 600 includes: forming, after the second channel stack is formed, a second dummy gate structure extending across the second channel stacks, the second dummy gate structure covering a part of a top portion and a part of a side wall of the second channel stacks; forming a second source-drain doping region 640 in the second channel stack on two sides of the second dummy gate structure; forming a second interlayer dielectric layer 660 on the second substrate 610 on a side portion of the second dummy gate structure, the second interlayer dielectric layer 660 covering the second source-drain doping region 640; removing the second dummy gate structure, and forming a second gate opening (not shown in the figure) in the second interlayer dielectric layer 660; removing a second sacrificial layer exposed from the second gate opening, and forming a second groove (not shown in the figure) in communication with the second gate opening; and forming a second device gate structure 630 in the second gate opening and a second trench, the second device gate structure 630 surrounding the second channel layer 625.

Therefore, in this form, the second channel layer 625 and the second fin 611 that are located at the bottom are disposed at an interval.

In this form, a second spacer (not shown) is further formed on the side wall of the second device gate structure 430, and a second inner spacer is further formed between the second device gate structure 430 under the second channel layer 625 and the second source-drain doping region 640.

It is to be noted that, for detailed description of the second source-drain doping region 640, the second spacer, and the second inner spacer and forming methods thereof, reference may be respectively made to the corresponding description of the first source-drain doping region 440, the first spacer, and the first inner spacer as details are not described herein again.

Figure 15:
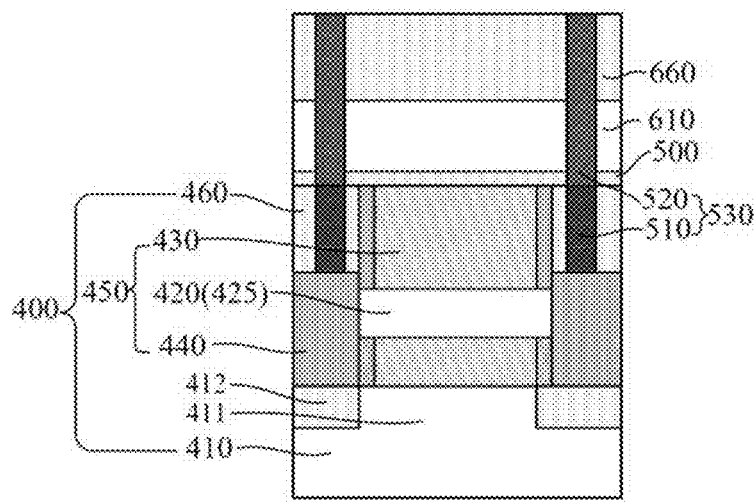

With reference to FIG. 15, FIG. 15 is a cross-sectional view based on FIG. 13. After the second device structure 600 is formed, the forming method further includes: forming a top source-drain plug 520, penetrating the second interlayer dielectric layer 660 and the second substrate 610 above the first source-drain doping region 440. The top source-drain plug 520 is connected to the bottom source-drain plug 510. The top source-drain plug 520 and the bottom source-drain plug 510 are configured to form a first source-drain plug 530.

The top source-drain plug 520 is electrically connected to the first source-drain doping region 440 by the bottom source-drain plug 510, and therefore, the first source-drain plug 530 is configured to lead out the electricity of the first source-drain doping region 440.

In this form, a top portion of the top source-drain plug 520 is flush with a top portion of the second interlayer dielectric layer 660, and the top source-drain plug 520 is made of copper. Specifically, the top source-drain plug 520 is formed through processes such as etching, deposition, and planarization. The forming method of the top source-drain plug 520 is similar to the forming method of the bottom source-drain plug 510, and details are not repeated in this form.

Figure 16:
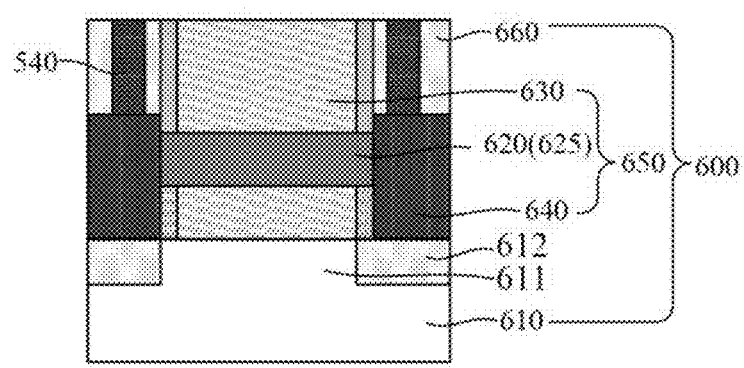

With reference to FIG. 16, FIG. 16 is a cross-sectional view based on FIG. 14. After the second device structure 600 is formed, the forming method further includes: forming a second source-drain plug 540, penetrating the second interlayer dielectric layer 660 above the second source-drain doping region 640. The second source-drain plug 540 is connected to the second source-drain doping region 640.

The second source-drain plug 540 is configured to lead out the electricity of the second source-drain doping region 640.

In this form, a top portion of the second source-drain plug 540 is flush with the top portion of the second interlayer dielectric layer 660, and the second source-drain plug 540 is made of copper. Specifically, the second source-drain plug 540 is formed through processes such as etching, deposition, and planarization. The forming method of the second source-drain plug 540 is similar to the forming method of the bottom source-drain plug 510, and details are not repeated in this form.

Although the present disclosure is described above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:
    a first device structure, comprising a first substrate and a first device formed on the first substrate, the first device comprising a first channel layer structure located on the first substrate, a first device gate structure extending across the first channel layer structure, and a first source-drain doping region located in the first channel layer structure on two sides of the first device gate structure, a surface, close to a top portion of the first device gate structure, in the first device structure being a front surface; and
    a second device structure, located on the front surface of the first device structure, and comprising a second substrate located on the first device structure and a second device formed on the second substrate, the second device comprising a second channel layer structure located on the second substrate, a second device gate structure extending across the second channel layer structure, and a second source-drain doping region located in the second channel layer structure on two sides of the second device gate structure,
    wherein projections of the second channel layer structure and the first channel layer structure onto the first substrate intersect non-orthogonally.

2. The semiconductor structure according to claim 1, wherein an angle between the projections of the second channel layer structure and the first channel layer structure onto the first substrate is 5° to 85°.

3. The semiconductor structure according to claim 2, wherein the angle between the projections of the second channel layer structure and the first channel layer structure onto the first substrate is 45°.

4. The semiconductor structure according to claim 1, wherein:
    in the first device structure, there is a plurality of first channel layer structures, the first channel layer structures of the plurality of first channel layer structures are arranged in parallel, and there is a first pitch between adjacent first channel layer structures; and in the second device structure, there is a plurality of second channel layer structures, the second channel layer structures of the plurality of second channel layer structures are arranged in parallel, there is a second pitch between adjacent second channel layer structures, and the second pitch is not equal to the first pitch.

5. The semiconductor structure according to claim 4, wherein an absolute value of a difference between the second pitch and the first pitch is 1 nm to 5 nm.

6. The semiconductor structure according to claim 1, wherein:

the first device structure further comprises: a first interlayer dielectric layer, located on the first substrate on a side portion of the first device gate structure, the first interlayer dielectric layer covering a side wall of the first device gate structure; and the semiconductor structure further comprises: a bottom source-drain plug, penetrating the first interlayer dielectric layer above the first source-drain doping region, and connected to the first source-drain doping region.

7. The semiconductor structure according to claim 6, wherein:

the second device structure further comprises: a second interlayer dielectric layer, located on the second substrate on a side portion of the second device gate structure, the second interlayer dielectric layer covering a side wall of the second device gate structure; and the semiconductor structure further comprises: a top source-drain plug, penetrating the second interlayer dielectric layer and the second substrate above the first source-drain doping region, and connected to the bottom source-drain plug.

8. The semiconductor structure according to claim 1, wherein the second device structure is bonded to the front surface of the first device structure.

9. The semiconductor structure according to claim 8, wherein the semiconductor structure further comprises: a bonding layer, located between the front surface of the first device structure and the second substrate.

10. The semiconductor structure according to claim 9, wherein the material of the bonding layer comprises silicon oxide.

11. The semiconductor structure according to claim 1, wherein:

the first channel layer structure is a first fin protruding from the first substrate; or the first channel layer structure and the first substrate are disposed at an interval, the first channel layer structure comprising one or more first channel layers disposed at an interval in a normal direction on a surface of the first substrate; and the second channel layer structure is a second fin protruding from the second substrate; or the second channel layer structure and the second substrate are disposed at an interval, the second channel layer structure comprising one or more second channel layers disposed at an interval in a normal direction on a surface of the second substrate.

12. The semiconductor structure according to claim 1, wherein:

the first device is an N-channel metal oxide semiconductor (NMOS) device, and the second device is a P-channel metal oxide semiconductor (PMOS) device; or the first device is a PMOS device, and the second device is an NMOS device.

* * * * *